United States Patent
Ni et al.

(10) Patent No.: US 8,248,090 B2
(45) Date of Patent: Aug. 21, 2012

(54) ZIF CONNECTORS AND SEMICONDUCTOR TESTING DEVICE AND SYSTEM USING THE SAME

(75) Inventors: Cheng-Chin Ni, Hsin-Chu (TW); Pei-Luen Hsu, Hsin-Chu (TW)

(73) Assignee: King Yuan Electronics Co., Ltd, Hsin-Chu (TW)

( * ) Notice: Subject to any disclaimer, the term of this patent is extended or adjusted under 35 U.S.C. 154(b) by 638 days.

(21) Appl. No.: 12/413,553

(22) Filed: Mar. 28, 2009

(65) Prior Publication Data
US 2010/0164524 A1  Jul. 1, 2010

(30) Foreign Application Priority Data
Dec. 30, 2008 (TW) .............................. 97151324 A

(51) Int. Cl.
*G01R 31/00* (2006.01)

(52) U.S. Cl. .................................................. 324/750.29

(58) Field of Classification Search ......................... None
See application file for complete search history.

(56) References Cited

U.S. PATENT DOCUMENTS

| | | | | |
|---|---|---|---|---|
| 3,221,286 A | * | 11/1965 | Feede | 439/67 |
| 4,973,256 A | * | 11/1990 | Peters | 439/66 |
| 5,828,223 A | * | 10/1998 | Rabkin et al. | 324/750.19 |
| 6,014,533 A | * | 1/2000 | Kawana | 399/90 |
| 6,642,729 B2 | * | 11/2003 | Kang et al. | 324/756.03 |
| 7,230,437 B2 | * | 6/2007 | Eldridge et al. | 324/754.07 |
| 7,639,028 B2 | * | 12/2009 | Yuan-Chi | 324/756.03 |

* cited by examiner

*Primary Examiner* — Paresh Patel
(74) *Attorney, Agent, or Firm* — Ming Chow; Sinorica, LLC

(57) ABSTRACT

A ZIF connector and a semiconductor testing device using the ZIF connectors are provided. The ZIF connector comprises a body portion and a clamping portion. The body portion is a print circuit board provided with circuit patterns, and further comprises a plurality of signal holes disposed on an upper part of the body portion for electrically connecting a plurality of corresponding signal cables, and a plurality of electrical terminals disposed on a lower part of the body portion and arranged on two lateral sides of the body portion for electrically connecting a plurality of corresponding electrical pads of a substrate. The circuit patterns are provided in the body portion to connect to the electrical terminals through the signal holes accordingly. The clamping portion is horizontally extended on one lateral side of the body portion for securing the ZIF connector in a connector board.

5 Claims, 6 Drawing Sheets

ZIF CONNECTORS AND SEMICONDUCTOR TESTING DEVICE AND SYSTEM USING THE SAME

BACKGROUND OF THE INVENTION

1. Technical Field

The present invention relates to a ZIF connector and a semiconductor testing device. More particularly, the present invention relates to a ZIF connector provided with circuit patterns, and also relates to a semiconductor testing device including the ZIF connector.

2. Description of Related Art

ZIF (Zero Insertion Force) connectors are commonly used in semiconductor testing devices or apparatuses. Please refer to FIG. 1 for an assembly of a conventional ZIF connector 11 and a test load board 12 (or a substrate of a probe card). As can be seen in the drawing, a rivet 14 directly passes through holes 16 of the ZIF connector 11 and of the test load board 12 to fasten the ZIF connector 11 to the test load board 12. Besides, two lines of golden fingers 13 flanking the ZIF connector 11 are electrically connected with a female header (not shown) of the ZIF connector 11. In the aforementioned rivet-based assembly, only when the magnitude and direction of force exerted to swage the rivet 14 are precisely controlled can all the golden fingers 13 properly contact electrical pads (not shown) formed on the test load board 12 while a predetermined interval A and a predetermined pre-pressure are maintained, thereby establishing a stable impedance match and in turn obtaining stable testing signals. In wafer testing, since the ZIF connector 11 typically undergoes repeated insertion to and extraction from the female header thereof, the golden fingers 13 will get worn and torn so that the interval A and the pre-pressure are changed. Eventually, when poor contact adversely affecting the testing results happens between the golden fingers 13 and the test load board 12, the entire probe card must be checked and maintenance performed.

Moreover, due to the particular structure of the conventional ZIF connector, interface impedances exist between the golden fingers 13 and the fastener (e.g., the rivet 14) and between the golden fingers 13 and the conventional large-scaled print circuit board 12, respectively. Such interface impedances distort the testing signals passing through the golden fingers 13. In addition, the conventional large-scaled expensive print circuit board 12 is large-scaled so that the print circuit board 12 has to keep coplanar contact with a plurality of conventional ZIF connectors via golden fingers exposed from conventional ZIF connectors to avoid poor contact between the print circuit board 12 and conventional ZIF connectors. Therefore, in practice, the conventional ZIF connectors bring adverse effects to semiconductor testing applications.

SUMMARY OF THE INVENTION

In view of the shortcomings of the prior art, the present invention proposes a ZIF connector with novel structure. The ZIF connector comprises a body portion and a clamping portion, wherein the body portion is an embedded small-scaled print circuit board with circuit patterns. The body portion further comprises a plurality of signal holes disposed on an upper part of the body portion for electrically connecting a plurality of corresponding signal cables and a plurality of electrical terminals disposed on a lower part of the body portion and arranged on two opposite lateral sides of the body portion for electrically connecting a plurality of corresponding electrical pads of a substrate.

The plurality of electrical terminals is electrically connected with the plurality of signal holes through the circuit patterns in the body portion. The clamping portion is horizontally extended on one lateral side of the body portion for securing the ZIF connector on a connector board.

Hence, a first objective of the present invention is to provide a novel ZIF connector having a body portion with an embedded print circuit board of small scale and thereby to eliminate the necessity of maintaining a conventional large-scaled expensive print circuit board to have coplanar contact with a plurality of conventional ZIF connectors via golden fingers exposed from conventional ZIF connectors as well as to achieve cost reduction without using the conventional large-scaled expensive print circuit board.

A second objective of the present invention is to provide a plurality of novel ZIF connectors detachably arranged in a connector board for electrically connecting the ZIF connectors with a test load board such that the individual broken ZIF connector can be easily removed from the connector board and can also be replaced with new ZIF connector without taking apart the entire test load board.

A third objective of the present invention is to provide a novel ZIF connector with a small-scaled print circuit board, in which each of the electrical terminals of the ZIF connector is electrically connected with each of the signal holes through the circuit patterns.

A fourth objective of the present invention is to provide a novel ZIF connector with a small-scaled print circuit board, in which the circuit patterns enable electrical connection directly between the plurality of signal holes and the plurality of electrical terminals, thereby suppressing interface impedances generated from the contacting surface of the ZIF connector.

A fifth objective of the present invention is to provide a novel ZIF connector with a small-scaled print circuit board, in which the circuit patterns enable electrical connection directly between the plurality of signal holes and the plurality of electrical terminals, thereby shortening signal passing route through the ZIF connector internally.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

While the present invention provides a ZIF connector and a semiconductor testing device and a testing system having ZIF connectors, the testing principles are known to one of ordinary skill in the art and need not to be discussed at any length herein. Meanwhile, the accompanying drawings referred to in the following description are provided for illustrative purposes and therefore are not and need not be made to scale.

Figure 2A:
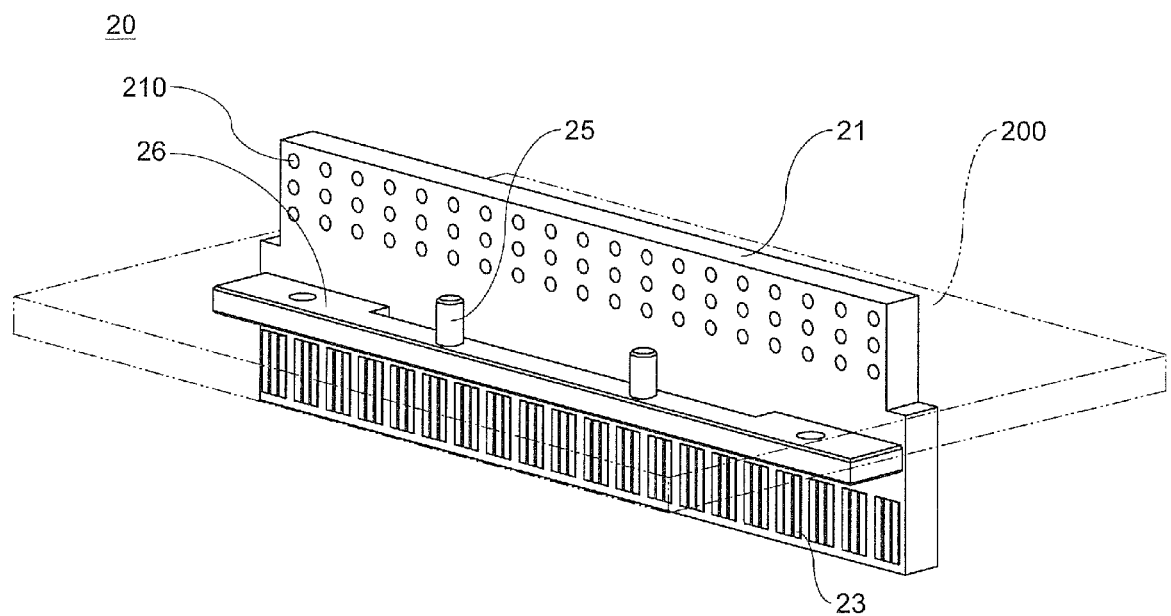
FIG. 2A is a perspective view of a ZIF connector according to a first preferred embodiment of the present invention, showing connection of the ZIF connector with a connector board.
Figure 2B:
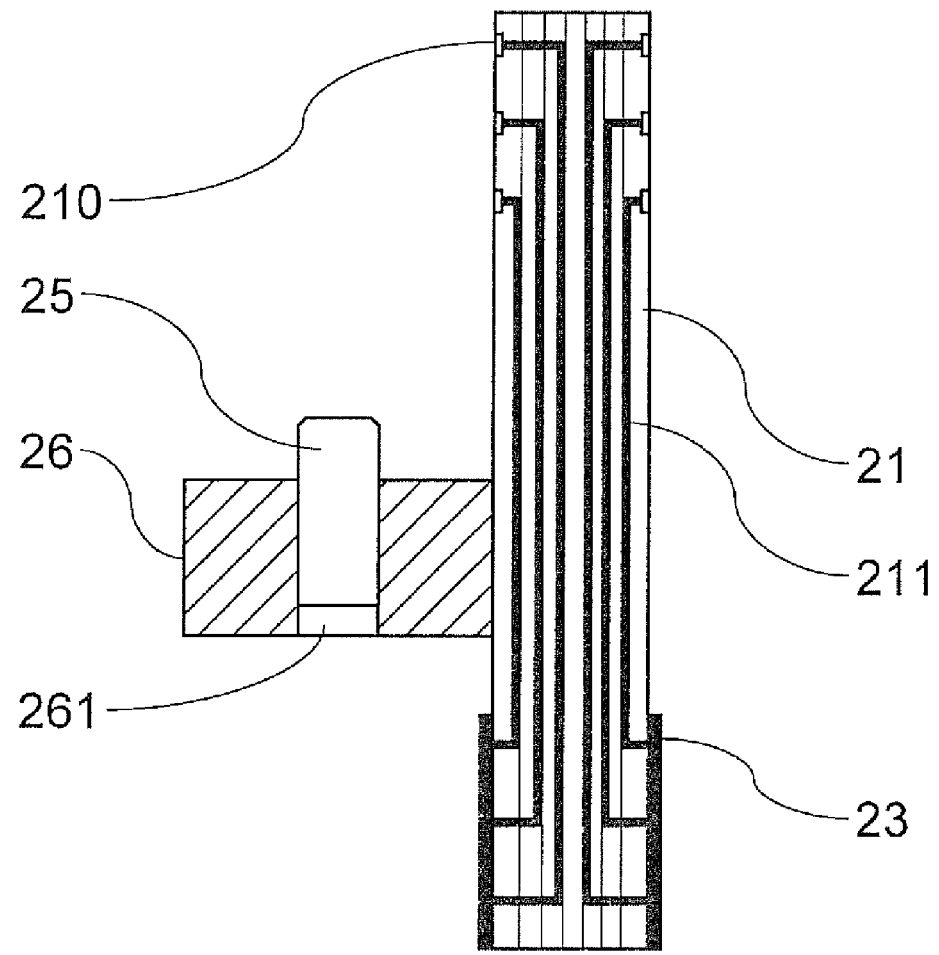
FIG. 2B is a sectional view of the ZIF connector according to the first preferred embodiment of the present invention, showing internal structure of the ZIF connector.
Figure 2C:
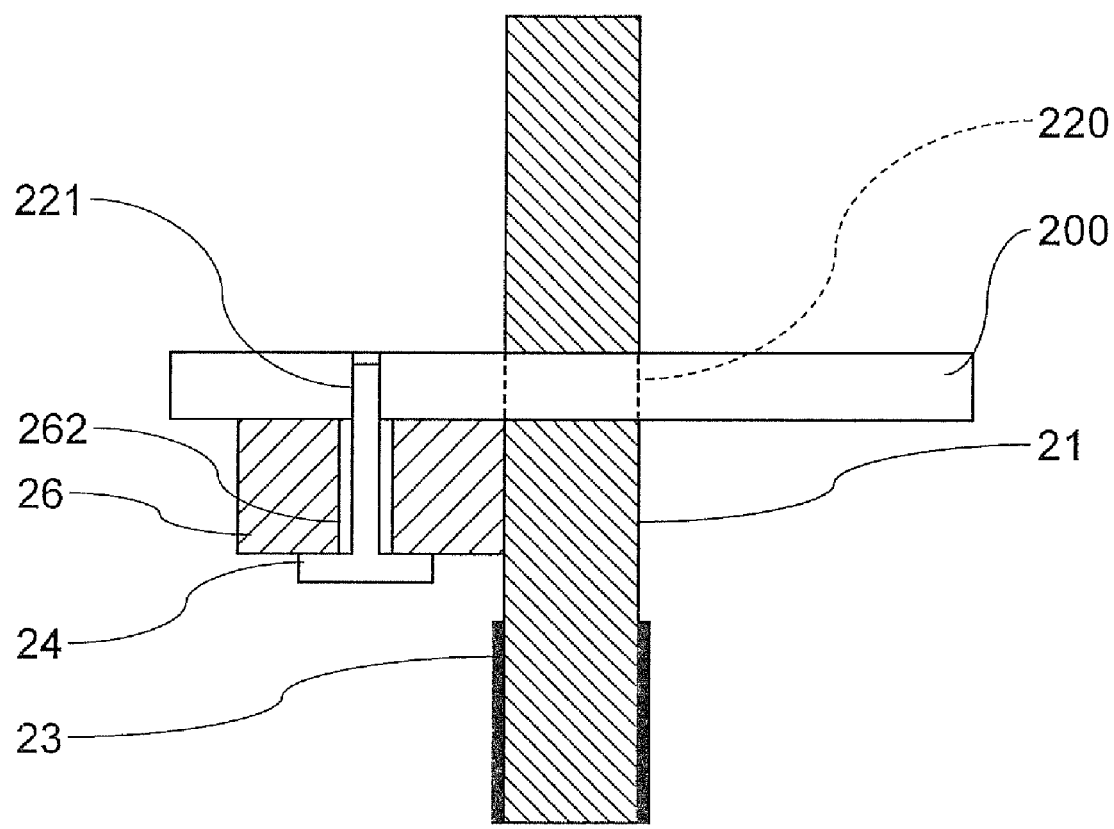
FIG. 2C is a 3D view of an assembly of the ZIF connector according to the first preferred embodiment of the present invention and a connector board.

Please refer to FIGS. 2A through 2C for a perspective view and a sectional view of a ZIF connector 20 according to a first preferred embodiment of the present invention, respectively. The ZIF connector 20 comprises a body portion 21 and a clamping portion 26, wherein the body portion 21 is an embedded small-scaled print circuit board suitable for size of the ZIF connector 20, and the small-scaled print circuit board is provided with circuit patterns 211. The body portion 21 further comprises a plurality of signal holes 210 disposed on an upper part of the body portion 21 and a plurality of electrical terminals 23 disposed on a lower part of the body portion 21 and arranged on two opposite lateral sides of the body portion 21. Herein, the electrical terminals 23 are similar to the traditional golden fingers. Each of the signal holes 210 is electrically connected with a signal cable 350 shown in FIG. 3 while the electrical terminals 23 is electrically connected with a plurality of electrical pads (not shown) of a substrate such as a motherboard 37 shown in FIG. 3 capable of being pluggable. Besides, the circuit patterns 211 in the body portion 21 is provided to electrically connect each of the electrical terminals 23 with the corresponding one of the signal holes 210. It is to be noted that the ZIF connector 20 has the small-scaled print circuit board, and the circuit patterns 211 of the small-scaled circuit board is formed in multilayer fashion that is electrically connected the signal holes 210 with the electrical terminals 23, so as to eliminate the necessity of maintaining a conventional large-scaled print circuit board to have necessarily coplanar contacted with the conventional ZIF connectors via the golden fingers exposed from the conventional ZIF connectors as well as to suppress the interface impedances that is generated from the contacting surfaces of the ZIF connector 20. Besides, referred back to FIG. 2A, a connector board 200 indicated by a hypothetical line shows that each of the ZIF connectors 20 can be plugged into the connector board 200.

Referring to FIG. 2B, according to the above embodiment, the clamping portion 26 further comprises a guiding member 25 and a guiding hole 261, wherein the guiding hole 261 is provided for receiving the guiding member 25. When the ZIF connector 20 is to be assembled with the connector board 200, the guiding member 25 of the ZIF connector 20 guides the ZIF connector 20 to be precisely positioned and retained in a slot 220 indicated by a dot line of the connector board 200 as shown in FIG. 2C. In addition, referring back to FIG. 2C, the clamping portion 26 is horizontally extended on one lateral side of the body portion 21, so that a fastener 24 passing through a second fastening hole 221 and a first fastening hole 262 secures the ZIF connector 20 firmly in the connector board 200.

Figure 1:
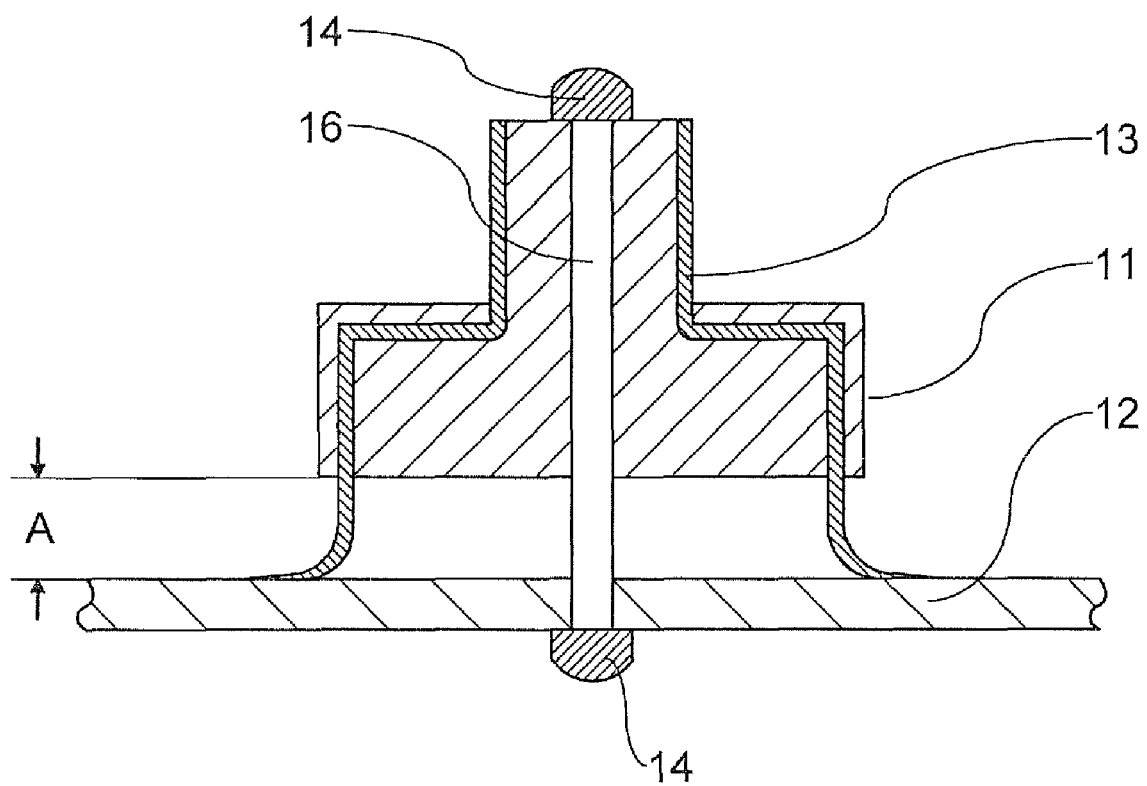
FIG. 1 is a sectional view of an assembly of a conventional ZIF connector and a test load board.
Figure 3:
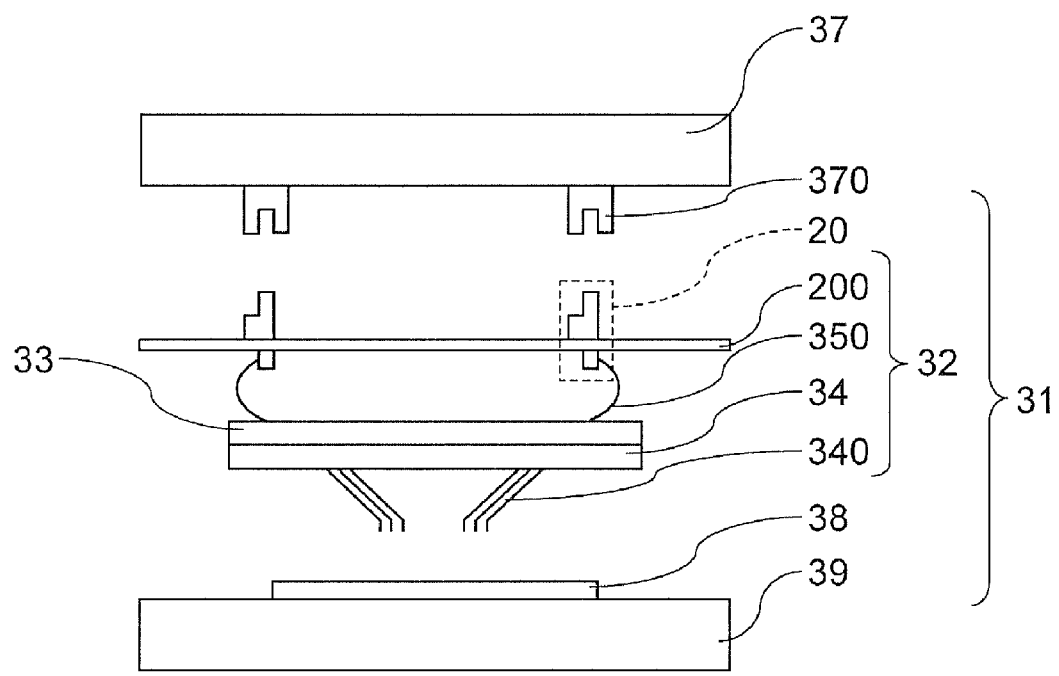
FIG. 3 is a schematic drawing of a semiconductor testing device and system for testing wafers according to a second, third, and fourth preferred embodiment of the present invention.

FIG. 3 is a schematic drawing of a semiconductor testing device 32 having ZIF connectors 20 according to a second preferred embodiment of the present invention. The semiconductor testing device 32 is configured to test a wafer 38. The semiconductor testing device 32 comprises a connector board 200, a test load board 33, and a probe card 34, wherein the connector board 200 serves to carry a plurality of the ZIF connectors 20 for each of which is embedded with small-scaled print circuit board, and the connector board 200 guides signal holes (not shown) of the ZIF connectors 20 to connect with signal cables 350 so that the signal holes of the ZIF connectors 20 are further electrically connected with the test load board 33 through the signal cables 350 while the test load board 33 is in turn electrically connected with the probe card 34. Therefore, any of the individual broken ZIF connector 20 can be easily removed from the connector board 200 and replaced with new one without taking apart the entire test load board 33 or the whole testing device 32. Besides, the signal passing routes through the ZIF connector 20 internally can be shortened compared to the conventional ZIF connector 11 in FIG. 1. The probe card 34 comprises a plurality of probes 340 for contacting a surface of the wafer 38 so as to perform wafer testing. Besides, each ZIF connector 20 has the same structural features and the same mode of assembly with the connector board 200 as the ZIF connector 20 in the first preferred embodiment. While pre-pressed contact with a predetermined interval between the conventional ZIF connector 11 and the test load board 12 must be maintained, the ZIF connectors 20 of the present invention are clamped by the connector board 200 and electrically connected with the test load board 33 through the signal cables 350, thereby protecting the test load board 33 from being damaged by the impact ensuing from repeated insertion and extraction of the ZIF connectors 20 to and from female connectors 370 of the motherboard 37.

Another semiconductor testing device 31 according to a third preferred embodiment of the present invention is also illustrated in FIG. 3. The semiconductor testing device 31 (i.e., a prober) serves to test a wafer 38. The semiconductor testing device 31 comprises a wafer chuck 39, a probe card 34, a test load board 33, and a connector board 200. The wafer chuck 39 is movable in X-Y-Z directions so as to bring the wafer 38 to be tested close to and in contact with probes 340 of the probe card 34 for wafer testing. In the present embodiment, the connector board 200 and the test load board 33 have the same structural features and the same mode of assembly with relevant components as their counterparts in the first preferred embodiment.

Another semiconductor testing device 30 for testing a wafer 38 according to a fourth preferred embodiment of the present invention is also illustrated in FIG. 3. The semiconductor testing device 30 comprises a prober 31 and a motherboard 37. The prober 31 comprises a wafer chuck 39, a probe card 34, a test load board 33, and a connector board 200 which is provided with a plurality of ZIF connectors 20. The motherboard 37 has a plurality of female connectors 370 corresponding to the position of the ZIF connectors 20, so that the required testing signals can be provided to the wafer 38 to be tested according to the testing specifications of the wafer 38. In the present embodiment, the prober 31 has the same structural features and the same mode of assembly with relevant components as its equivalent in the third preferred embodiment.

Figure 4:
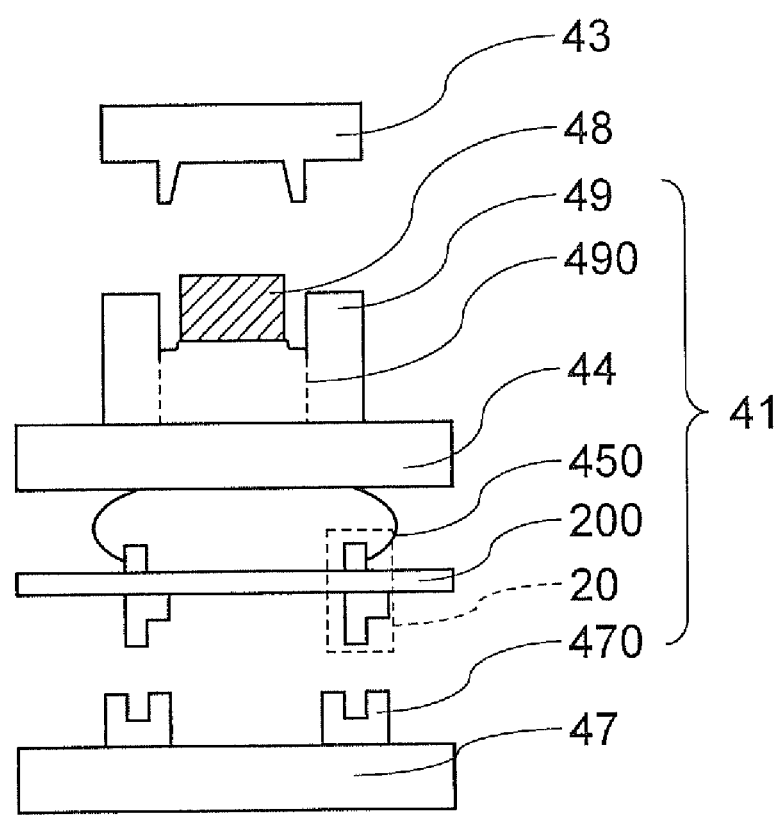
FIG. 4 is a schematic drawing of a semiconductor testing device and system for testing an IC element according to a fifth and sixth preferred embodiments of the present invention.

FIG. 4 is a schematic drawing drawn according to a fifth preferred embodiment of the present invention. The fifth preferred embodiment of the present invention relates to a semiconductor testing device 41 for testing an IC element. The semiconductor testing device 41 comprises a connector board 200, a probe card 44, and a socket 49. The connector board 200 serves to carry a plurality of ZIF connectors 20 and guides a plurality of signal holes (not shown) of the ZIF connectors 20 to connect with the signal cables 450 so that the signal holes are electrically connected to the probe card 44 through the signal cables 450 while the probe card 44 is electrically connected to the socket 49. The socket 49 comprises a plurality of probes 490 passing through the socket 49 in lengthwise direction for contacting an IC element 48 to be tested for IC testing. The ZIF connectors 20 are clamped by the connector board 200 and electrically connected with the probe card 44 and the socket 49 through the signal cables 450, such that the ZIF connector 20 can be protected from being directly damaged by the impact that is generated by the insertion and extraction between the IC element 48 and the socket 49. Besides, each of the ZIF connector 20 has the same structural features and the same mode of assembly with the connector board 200 as the ZIF connector 20 in first preferred embodiment.

A semiconductor testing system 40 for testing an IC element according to a sixth preferred embodiment of the present invention also as illustrated in FIG. 4. The semiconductor testing system 40 comprises a pressing arm 43, a socket 49, a probe card 44, a connector board 200, and an adaptor board 47. The pressing arm 43 is provided to press upon an IC element 48 settled in the socket 49 to ensure that the pins of the IC element 48 contact probes 490 of the socket 49 properly. Besides, the socket 49, the probe card 44, and the connector board 200 have the same structural features and the same mode of assembly as their equivalents in the fifth preferred embodiment. Moreover, the adaptor board 47 has a plurality of female connectors 470 corresponding in position to the ZIF connectors 20, so as to connect therewith and provide the required testing signals to the IC element 48 to be tested according to the testing specifications of the IC element 48.

The present invention has been described by reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A semiconductor testing device, comprising a connector board, a test load board, and a probe card, wherein the connector board comprises a plurality of ZIF connectors and guides the ZIF connectors to connect with the test load board, the test load board being electrically connected to the probe card, the probe card comprising probes for testing a wafer to be tested, the semiconductor testing device being characterized in:
    each said ZIF connector comprising a body portion and a clamping portion, wherein:
    the body portion is an embedded print circuit board with circuit patterns and the body portion comprises:
        a plurality of signal holes disposed on an upper part of the body portion for electrically connecting a plurality of signal cables; and
        a plurality of electrical terminals disposed on a lower part of the body portion and arranged on two opposite lateral sides of the body portion for electrically connecting a plurality of electrical pads of a substrate, wherein the circuit patterns of the body portion electrically connect to the electrical terminals through the signal holes; and
    the clamping portion is horizontally extended on one said lateral side of the body portion for securing each said ZIF connector in the connector board.

2. A semiconductor testing device, comprising a wafer chuck, a probe card, a test load board, and a connector board, wherein the connector board comprises a plurality of ZIF connectors and guides the ZIF connectors to connect with the test load board, the test load board being electrically connected to the probe card, the wafer chuck being movable in X-Y-Z directions and configured for carrying a wafer to be tested, the probe card comprising probes for testing the wafer to be tested, the semiconductor testing device being characterized in:
    each said ZIF connector comprising a body portion and a clamping portion, wherein:
    body portion is an embedded print circuit board with circuit patterns and the body portion comprises:
        a plurality of signal holes disposed on an upper part of the body portion for electrically connecting a plurality of signal cables; and
        a plurality of electrical terminals disposed on a lower part of the body portion and arranged on two opposite lateral sides of the body portion for electrically connecting a plurality of electrical pads of a substrate, wherein the circuit patterns of the body portion electrically connect to the electrical terminals through the signal holes; and
    the clamping portion is horizontally extended on one said lateral side of the body portion for securing each said ZIF connector in the connector board.

3. A semiconductor testing device, provided for testing a wafer, comprising a prober and a motherboard, wherein:
    the prober at least comprises a wafer chuck, a probe card, a test load board, and a connector board, the connector board comprising a plurality of ZIF connectors and guiding the ZIF connectors to connect with the test load board, the test load board being electrically connected to the probe card, the wafer chuck being movable in X-Y-Z directions and configured for carrying a wafer to be tested, the probe card comprising probes for testing the wafer to be tested; and
    the motherboard has a plurality of female connectors corresponding to the ZIF connectors so as to connect therewith and provide proper testing signals according to testing specifications of the wafer to be tested; the semiconductor testing system being characterized in:
    each said ZIF connector comprising a body portion and a clamping portion, wherein:
    the body portion is an embedded print circuit board with circuit patterns and the body portion comprises: a plurality of signal holes disposed on an upper part of the body portion for electrically connecting a plurality of signal cables;
    a plurality of electrical terminals disposed on a lower part of the body portion and arranged on two opposite lateral sides of the body portion for electrically connecting a plurality of electrical pads of the motherboard, wherein the circuit patterns of the body portion electrically connect to the electrical terminals through the signal holes; and
    the clamping portion is horizontally extended on one said lateral side of the body portion for securing each said ZIF connector in the connector board.

4. A semiconductor testing device, provided for testing an IC element, comprising a connector board, a probe card and a socket, the connector board comprising a plurality of ZIF connectors and guiding the ZIF connectors to connect with the probe card, the probe card being electrically connected to the socket, the socket serving to receive the IC element and comprising a plurality of probes passing lengthwise through the socket for electrically contacting the IC element, the semiconductor testing device being characterized in:
    each said ZIF connector comprising a body portion and a clamping portion, wherein: the body portion is an embedded print circuit board with circuit patterns and the body portion comprises:
- a plurality of signal holes disposed on an upper part of the body portion for electrically connecting a plurality of signal cables;
- a plurality of electrical terminals disposed on a lower part of the body portion and arranged on two opposite lateral sides of the body portion for electrically connecting a plurality of electrical pads of a substrate, wherein the circuit patterns of the body portion electrically connect to the electrical terminals through the signal holes; and the clamping portion is horizontally extended on one said lateral side of the body portion for securing each said ZIF connector in the connector board.

5. A semiconductor testing device, provided for testing an IC element, comprising a connector board, a probe card, a socket, a pressing arm and an adaptor board, the connector board comprising a plurality of ZIF connectors and guiding the ZIF connectors to connect with the probe card, the probe card being electrically connected to the socket, the socket serving to receive the IC element and comprising a plurality of probes passing lengthwise through the socket for electrically contacting the IC element, the pressing arm pressing upon the IC element to make the IC element contact the probes of the socket, the semiconductor testing system being characterized in:

each said ZIF connector comprising a body portion and a clamping portion, wherein:
the body portion is an embedded print circuit board with circuit patterns and the body portion comprises:
- a plurality of signal holes disposed on an upper part of the body portion for electrically connecting a plurality of signal cables;
- a plurality of electrical terminals disposed on a lower part of the body portion and arranged on two opposite lateral sides of the body portion for electrically connecting a plurality of electrical pads of a substrate, wherein the circuit patterns of the body portion electrically connect to the electrical terminals through the signal holes; and the clamping portion is horizontally extended on one said lateral side of the body portion for securing each said ZIF connector in the connector board.

* * * * *